US009209757B1

(12) United States Patent
Thandri et al.

(10) Patent No.: US 9,209,757 B1
(45) Date of Patent: Dec. 8, 2015

(54) ENERGY-EFFICIENT PERSONAL AUDIO DEVICE OUTPUT STAGE WITH SIGNAL POLARITY-DEPENDENT POWER SUPPLY UPDATE RATE

(71) Applicant: Cirrus Logic, Inc., Austin, TX (US)

(72) Inventors: Bharath Kumar Thandri, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 213 days.

(21) Appl. No.: 14/067,485

(22) Filed: Oct. 30, 2013

(51) Int. Cl.
*H03F 99/00* (2009.01)
*H03F 3/181* (2006.01)
(52) U.S. Cl.
CPC ....................................... *H03F 3/181* (2013.01)
(58) Field of Classification Search
CPC ........................................................ H03F 3/181
USPC ............... 381/28, 82, 99, 107, 110, 120, 121; 324/300–322
See application file for complete search history.

(56) References Cited

U.S. PATENT DOCUMENTS 7,538,554 B2 * 5/2009 Wendt et al. .................. 324/322
8,660,277 B2 * 2/2014 Lesso et al. ................... 381/120

* cited by examiner

*Primary Examiner* — Md S Elahee
(74) *Attorney, Agent, or Firm* — Jackson Walker L.L.P.

(57) ABSTRACT

A charge pump power supply may comprise a plurality of capacitors and a switching circuit for switching the capacitors to provide a first voltage or a second voltage in accordance with the select input. The charge pump power supply may have a signal polarity input for indicating a polarity of an output audio signal. Switches for switching one or more capacitors providing a first polarity voltage in a then-current operating mode may be configured to switch at a greater frequency than switches for switching one or more capacitors providing a second polarity voltage responsive to the signal polarity input indicating a positive polarity of the output audio signal. Switches for switching one or more capacitors providing the first polarity voltage in a then-current operating mode are configured to switch at a lesser frequency than switches for switching one or more capacitors providing the second polarity voltage responsive to the signal polarity input indicating a negative polarity of the output audio signal.

24 Claims, 5 Drawing Sheets

FIG. 4A
MODE1 φ1

FIG. 4B
MODE1 φ2

FIG. 4C
MODE2 φ1

FIG. 4D
MODE2 φ2

FIG. 5A
MODE A Φ1, VOUT NEGATIVE

FIG. 5B
MODE A Φ2, VOUT NEGATIVE

FIG. 5C
MODE A Φ1, VOUT POSITIVE

FIG. 5D
MODE A Φ2, VOUT POSITIVE

ENERGY-EFFICIENT PERSONAL AUDIO DEVICE OUTPUT STAGE WITH SIGNAL POLARITY-DEPENDENT POWER SUPPLY UPDATE RATE

FIELD OF DISCLOSURE

The present disclosure relates in general to circuits for personal audio devices such as wireless telephones and media players, and more specifically, to systems and methods for conserving energy in a personal audio device output stage by controlling an output stage power supply based on a polarity of an audio signal.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s). In such topologies, power consumption is reduced by employing a power supply, typically a charge pump power supply, which has selectable modes of operation based on an amplitude of an audio output signal of the power amplifier, wherein each of the selectable modes provides a different bi-polar supply voltage across power supply rails of the power amplifier.

While such topologies are more energy efficient than predecessor topologies, such topologies may still waste power. For example, when an audio output signal is of a positive polarity, load current to the audio output is typically delivered only from a positive supply rail of the power amplifier, and a quiescent power may be wasted in maintaining a voltage on the negative supply rail by the power supply. Similarly, when an audio output signal is of a negative polarity, load current to the audio output is typically delivered only from a negative supply rail of the power amplifier, and a quiescent power may be wasted in maintaining a voltage on the positive supply rail by the power supply.

Therefore, it would be desirable to provide a power amplifier circuit for a consumer audio device that has improved efficiency and reduced power dissipation, while maintaining a specified full-signal output level capability.

SUMMARY

In accordance with the teachings of the present disclosure, the disadvantages and problems associated with existing approaches to driving audio output signals may be reduced or eliminated.

In accordance with embodiments of the present disclosure, an audio amplifier circuit for providing an output signal to an audio transducer may include a power amplifier and a charge pump power supply. The power amplifier may have an audio input for receiving an audio input signal, an audio output for providing the output signal, and a power supply input. The charge pump power supply may provide a power supply voltage to the power supply input, wherein the power supply voltage has a first polarity voltage relative to a common-mode voltage and a second polarity voltage relative to the common-mode voltage such that the power supply voltage equals a difference between the first polarity voltage and the second polarity voltage. The charge pump power supply may have a select input for selecting an operating mode of the power supply. In a first operating mode, the power supply voltage may be equal to a first voltage, and in a second operating mode the power supply voltage may be substantially equal to a rational fraction of the first voltage. The charge pump power supply may comprise a plurality of capacitors and a switching circuit for switching the capacitors to provide the first voltage or the second voltage in accordance with the select input. The charge pump power supply may have a signal polarity input for indicating a polarity of the output signal. Switches for switching one or more capacitors providing the first polarity voltage in a then-current operating mode are configured to switch at a greater frequency than switches for switching one or more capacitors providing the second polarity voltage responsive to the signal polarity input indicating a positive polarity of the output signal. Switches for switching one or more capacitors providing the first polarity voltage in a then-current operating mode are configured to switch at a lesser frequency than switches for switching one or more capacitors providing the second polarity voltage responsive to the signal polarity input indicating a negative polarity of the output signal.

In accordance with these and other embodiments of the present disclosure, a method for providing an output signal to an audio transducer may include providing by a charge pump power supply a power supply voltage to a power supply input of a power amplifier having an audio input for receiving an audio input signal and an audio output for providing the output signal. The power supply voltage may have a first polarity voltage relative to a common-mode voltage and a second polarity voltage relative to the common-mode voltage such that the power supply voltage equals a difference between the first polarity voltage and the second polarity voltage, wherein the common-mode voltage is equal to a mean of a maximum first polarity voltage and a minimum second polarity voltage. The charge pump power supply may have a select input for selecting an operating mode of the power supply. In a first operating mode, the power supply voltage may be equal to a first voltage, and in a second operating mode the power supply voltage may be substantially equal to a rational fraction of the first voltage. The charge pump power supply may comprise a plurality of capacitors and a switching circuit for switching the capacitors to provide the first voltage or the second voltage in accordance with the select input. The charge pump power supply may have a signal polarity input for indicating a polarity of the output signal. The method may also include operating switches for switching one or more capacitors providing the first polarity voltage in a particular operating mode at a greater frequency than switches for switching one or more capacitors providing the second polarity voltage responsive to the signal polarity input indicating a positive polarity of the output signal. The method may further include operating switches for switching one or more capacitors providing the first polarity voltage in the particular operating mode at a lesser frequency than switches for switching one or more capacitors providing the second polarity voltage responsive to the signal polarity input indicating a negative polarity of the output signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
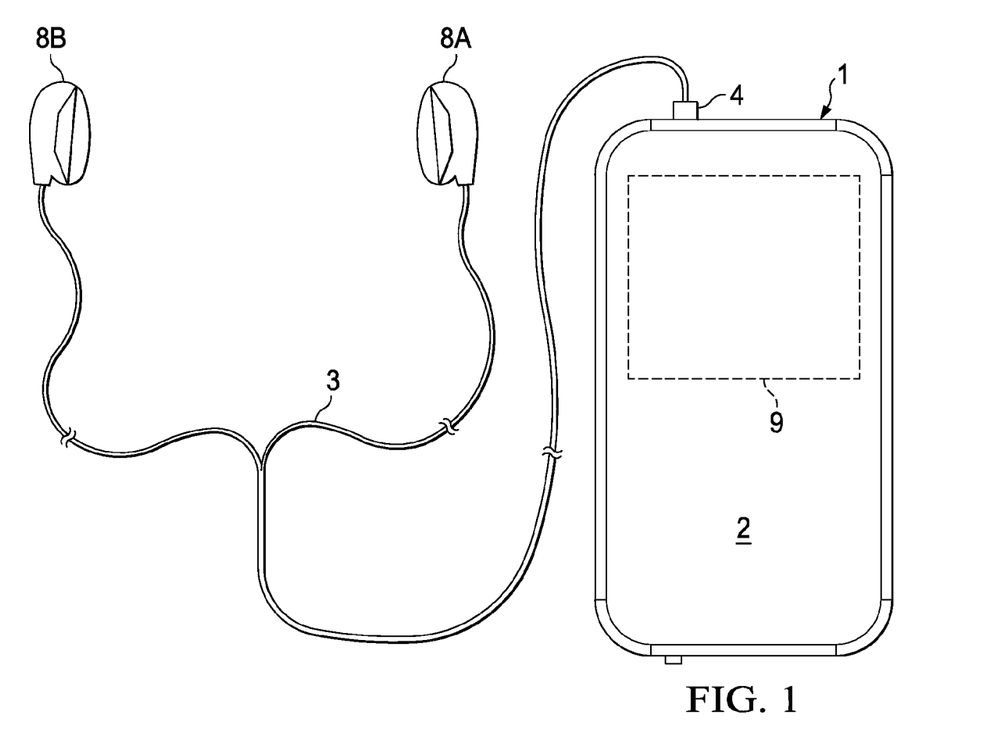
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer or speaker.

Figure 2:
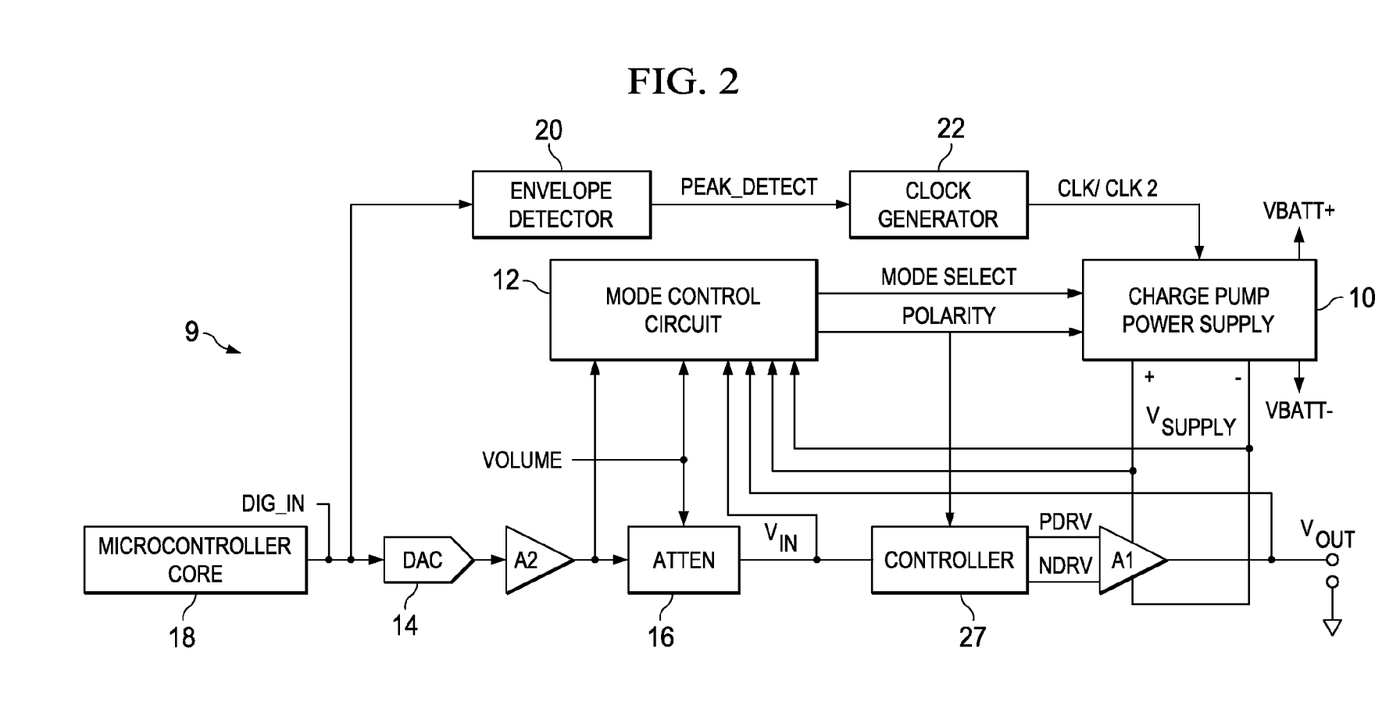
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may in turn supply an analog audio input signal to a first amplifier stage A2 that may be operated from a fixed voltage power supply. In the embodiments represented by FIG. 2, the input to DAC 14 may be a digital audio source, but that is not a limitation of the present disclosure, as the techniques of the present disclosure may be applied to an audio amplifier having a purely analog signal path. The signal at the output of first amplifier stage A2 may be provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism). While an attenuator 16 is shown as the volume control mechanism, it is understood that an equivalent volume control may be provided by a programmable resistor or adjustable gain in the feedback of amplifier A2 or another amplifier stage in the signal path. A controller 27 may generate predriver signals PDRV and NDRV based on the audio input signal $V_{IN}$ received from attenuator 16, and a final power amplifier stage A1 may amplify the predriver signals PDRV and NDRV to provide an audio output signal $V_{OUT}$, which may operate a speaker, headphone transducer, and/or a line level signal output.

In some embodiments, the power supply voltage $V_{SUPPLY}$ may comprise a single-ended voltage referenced to a ground voltage having a common-mode voltage equal to one-half of a maximum power supply voltage, and accordingly wherein the positive polarity voltage has a maximum equal to the maximum power supply voltage and the negative polarity voltage has a minimum equal to the ground voltage. In other embodiments, the power supply voltage $V_{SUPPLY}$ may comprise a differential voltage having a common-mode voltage equal to a mean of a maximum positive polarity voltage and a minimum negative polarity voltage. In both of these embodiments, the audio output signal $V_{OUT}$ may be considered to have a positive polarity when it is greater than the common-mode voltage and to have a negative polarity when it is lesser than the common-mode voltage. In embodiments in which $V_{SUPPLY}$ is a single-ended supply having a quiescent voltage substantially differing from ground, a capacitor may be utilized to couple the output of amplifier A1 to a transducer or line level output.

A charge pump power supply 10 may provide the power supply rail inputs of amplifier A1 and may receive a power supply input, generally from a battery or other power supply, depicted as battery terminal connections VBATT+ and VBATT−. A mode control circuit 12 may supply a mode select signal to charge pump power supply 10 that selects an operating mode of charge pump power supply 10 as described in greater detail elsewhere in this disclosure. Also, output voltage $V_{SUPPLY}$ of charge pump power supply 10 may be adjusted according to expected and/or actual audio signal levels at the amplifier output according to the techniques disclosed elsewhere in this disclosure.

When low signal levels exist and/or are expected at amplifier output $V_{OUT}$, the power efficiency of the audio output stage may be improved by varying the supply voltage $V_{SUPPLY}$ in conformity with the output signal $V_{OUT}$ or a signal (e.g., volume control signal Volume, audio input signal $V_{IN}$) indicative of the output signal $V_{OUT}$. In order to determine the actual and/or expected signal amplitudes at the output of amplifier A1, the volume control signal Volume, audio output signal $V_{OUT}$, and/or audio input signal $V_{IN}$ may be supplied to mode control circuit 12 for controlling the differential power supply $V_{SUPPLY}$ generated by charge pump power supply 10, in conformity with the expected amplitude of the output signal.

In addition, mode control circuit 12 may supply a polarity signal to charge pump power supply 10 indicative of a polarity of audio output signal $V_{OUT}$. In some embodiments, mode control circuit 12 may determine the polarity of audio output signal $V_{OUT}$ based on a sign bit of digital audio input signal DIG_IN. In other embodiments, mode control circuit 12 may determine the polarity of audio output signal $V_{OUT}$ by comparing a load current of a load coupled to the output of amplifier A1 to a quiescent current through at least one driving device of amplifier A1. In yet other embodiments, mode control circuit 12 may determine the polarity of audio output signal $V_{OUT}$ based on a voltage difference between supply voltage $V_{SUPPLY}$ and one or more of battery voltage VBATT+ and VBATT−.

In these and other embodiments, currents generated by switching devices of amplifier A1 may be controlled based on the polarity of audio output signal $V_{OUT}$. For example, power amplifier A1 may include at least one switching device for generating the positive polarity voltage of audio output signal $V_{OUT}$ and at least one switching device for generating the negative polarity voltage of audio output signal $V_{OUT}$ based on the audio input signal. As mentioned above, audio IC 9 may include a controller 27 configured to generate predriver signals PDRV and NDRV based on the audio input signal $V_{IN}$ received from attenuator 16. Predriver signal PDRV may drive the at least one switching device for generating the positive polarity voltage of audio output signal $V_{OUT}$ and predriver signal NDRV may drive the at least one switching device for generating the negative polarity voltage of audio output signal $V_{OUT}$. Responsive to a positive polarity of audio output signal $V_{OUT}$ (as indicated by the polarity signal generated by mode control circuit 12 or another component of audio IC 9), controller 27 may generate predriver signals PDRV and NDRV such that the at least one switching device for providing the positive polarity voltage operates at a first current and responsive to a negative polarity of audio output signal $V_{OUT}$, the at least one switching device for providing the positive polarity voltage operates at a second current less than the first current. Similarly, responsive to a negative polarity of audio output signal $V_{OUT}$, controller 27 may generate predriver signals PDRV and NDRV such that the at least one switching device for providing the negative polarity voltage operates at a first current and responsive to a positive polarity of audio output signal $V_{OUT}$, the at least one switching device for providing the negative polarity voltage operates at a second current less than the first current. Accordingly, audio IC 9 may utilize output signal polarity information to provide reduction in power consumption of a charge pump power supply, as compared with traditional approaches.

Figure 3:
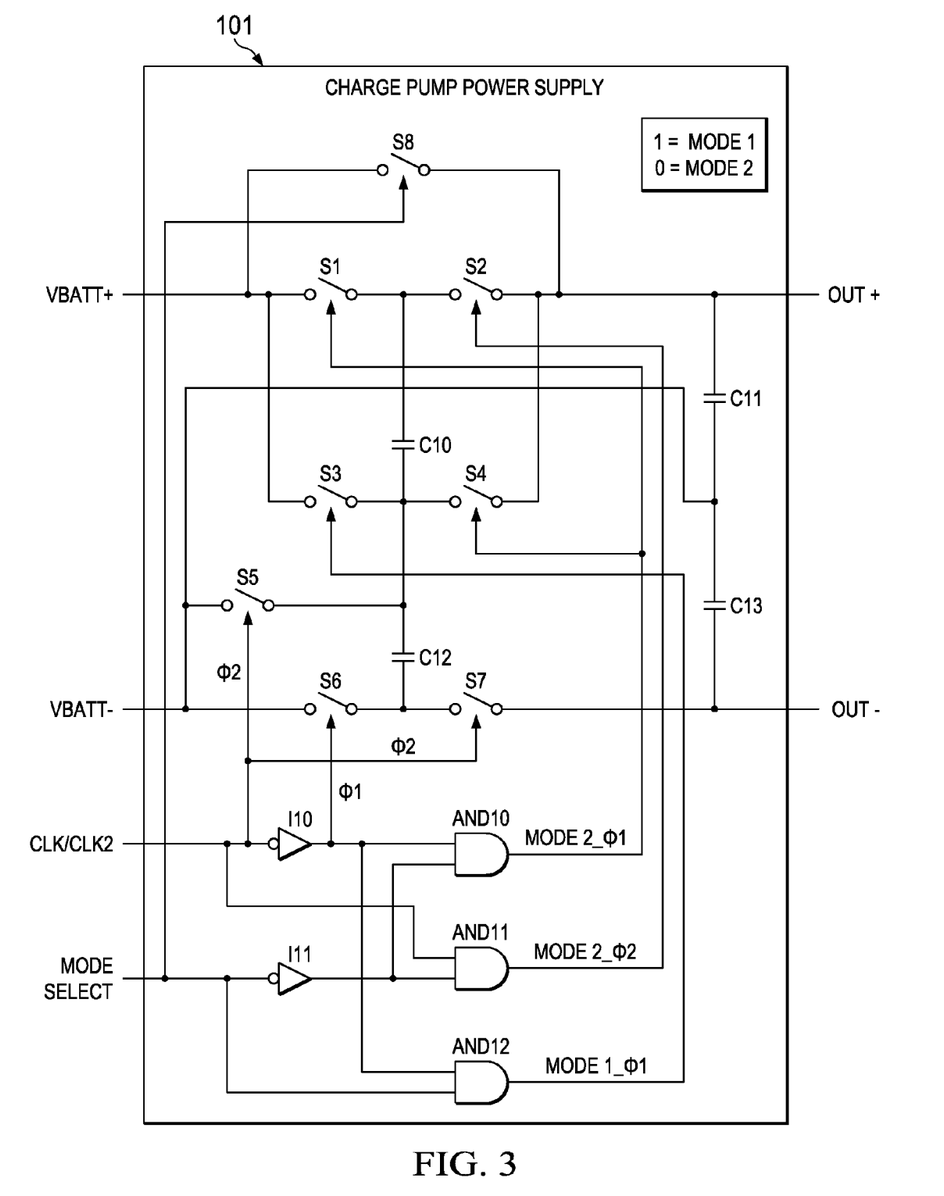
FIG. 3 is a schematic diagram depicting an example charge-pump power supply, in accordance with embodiments of the present disclosure.
Figure 4A:
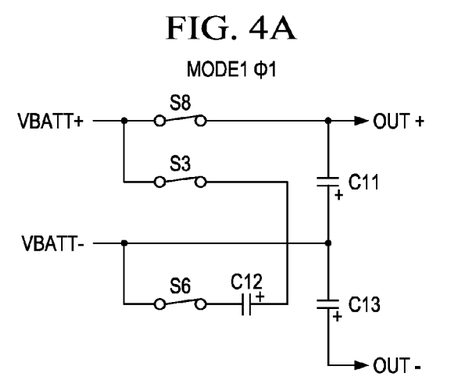
FIGS. 4A-4D are schematic diagrams depicting individual charge-pump clock phases for operating modes of the charge-pump power supply circuit depicted in FIG. 3, in accordance with embodiments of the present disclosure.
Figure 4B:
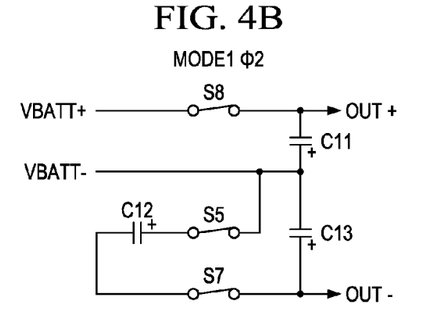

Referring now to FIG. 3 and additionally with reference to FIGS. 4A-4D, details of an example charge pump power supply 10 are depicted, in accordance with embodiments of the present disclosure. When a first operating mode (Mode 1) of charge pump power supply 10 is selected, as may be indicated by the MODE SELECT signal set in the logical high ("1") state, switch S8 may close, and the voltage VBATT+ may be applied directly to the positive polarity terminal (OUT+) of charge pump power supply 10. FIGS. 4A and 4B show an equivalent circuit arrangement for Mode 1 in first and second clock phases, respectively, omitting open switches and inactive circuit components. Switches S1, S2 and S4 are open and not activated in the first operating mode, as logical AND gates AND10 and AND11 disable the control signals to switches S1, S2 and S4, and the inverted Mode Select signal provided by inverter I10 is in a logical low ("0") state. For a single-ended (unipolar) power supply, capacitors C12-C13, switches S3, S6, and S7 may be omitted. As illustrated in FIGS. 4A and 4B, in Mode 1, the positive power supply voltage at the positive polarity terminal is supplied directly from the positive input terminal VBATT+.

To produce the negative output supply voltage in mode 1, the input voltage provided between input terminals VBATT+ and VBATT− is inverted by a voltage inverter. In phase one ($\phi_1$) of Mode 1, switches S3 and S6 may be closed, which may charge capacitor C12 by connection across input terminals VBATT+ and VBATT−, as illustrated in FIG. 4A. In phase two ($\phi_2$) of mode 1, switch S3 and switch S6 may open and switch S5 and switch S7 may close, which may reverse the terminal of capacitor C12 applied to the VBATT− input terminal. Switch S7 may apply the terminal of capacitor C12 that was applied to the VBATT− input terminal in phase one, to the negative polarity terminal (OUT−), as further illustrated by FIG. 4B. The switching action described above provides a negative voltage at the negative polarity terminal with respect to the VBATT− terminal that is substantially equal to the magnitude of the voltage between the positive polarity terminal and the VBATT− terminal, which acts as the reference midpoint voltage (ground) at the junction between output capacitors C11 and C13.

In a second operating mode (Mode 2), which may be active when the MODE SELECT signal is in the logical low ("0") state, switch S8 may be opened. In phase one ($\phi_1$) of Mode 2, switches S1 and S4 may be closed, which may apply capacitor C10 in series with output capacitor C11 across the VBATT+ and VBATT− terminals, as further illustrated in FIG. 4C. In phase two ($\phi_2$) of Mode 2, switches S1 and S4 may be opened and switches S2 and S5 may be closed, which may couple capacitor C10 in parallel with capacitor C11 as further illustrated in FIG. 4D. Because the second phase of mode 2 equalizes the voltage on capacitors C10 and C11, the stable operating point of the circuit may be such that the input voltage between the VBATT+ and VBATT− terminals will be split equally during the charging phase, irrespective of the relative capacitance of C10 and C11. Thus the voltage at the positive polarity output terminal in Mode 2 will be half of the voltage across the VBATT+ and VBATT− terminals. Other ratios can be constructed by switching more capacitors in series with capacitors C10 and C11 during phase one, and connecting them all in parallel during phase two. For example, a voltage of one third of the input battery voltage may be produced by using three capacitors connected alternatively in series across the battery terminals and parallel between the positive polarity terminal and the VBATT− terminal.

Figure 4C:
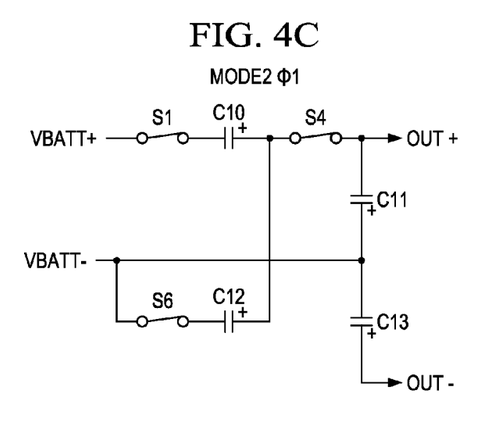
Figure 4D:
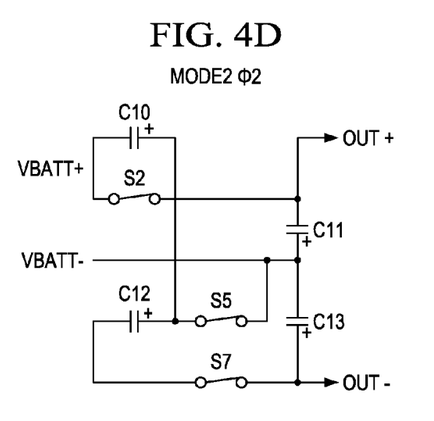

The negative supply in the second operating mode (Mode 2) may be provided in a manner similar to that of the first operating mode and the connections of capacitor C12 are shown in FIG. 4B and FIG. 4D, as being the same. However, as illustrated in FIG. 4C, because switch S8 is open in the second operating mode, during phase one of Mode 2, capacitor C12 is charged from the positive polarity terminal rather than the VBATT+ terminal as was shown in FIG. 4A for Mode 1. Switch S4 may perform the operation of connecting capacitor C12 to the positive polarity terminal, as illustrated in FIG. 4C, along with the above-described operation of applying capacitor C10 in series with capacitor C11 in phase one for the positive power supply and therefore the relative phases between the voltage inverter supplying the negative polarity terminal voltage and the circuit supplying the positive polarity terminal voltage must be maintained in the depicted configuration. Otherwise, eight switches may be utilized and the common connection between capacitor C10 and C12 broken. The additional switch may be provided between capacitor C12 and the positive polarity terminal, and would be active in Mode 2, phase 1. It is also possible to further reduce the number of switches from seven to six, by removing switch S3 and controlling switch S4 with the unqualified ($\phi_1$) signal. However, the inclusion of switch S3 may reduce the impedance of the power supply path in the first operating mode, which may be the highest voltage/current operating mode. Therefore, it may generally be advantageous to include switch S3 in the circuit.

In some embodiments, switches of the switching circuit integral to charge pump power supply 10 may be operated at a particular frequency based on a magnitude of audio output signal $V_{OUT}$. Turning again to FIG. 2, audio IC 9 may include an envelope detector 20 and a clock generator 22. Envelope detector 20 may comprise any system, device, or apparatus configured to detect when digital audio input signal DIG_IN (or another signal indicative of audio output signal $V_{OUT}$) is within a predetermined threshold of its maximum or minimum full-range magnitude, and generate a signal PEAK_DETECT when such signal indicative of audio output signal $V_{OUT}$ is within such threshold. Clock generator 22 may be any system, device, or apparatus (e,g, phase-locked loop, delay-locked loop, etc.) configured to generate one or more periodic clock signals (e.g., signals CLK and CLK2). In some embodiments, the clock signal CLK generated by clock generator 22 may be of a first frequency when signal PEAK_DETECT is asserted and a second frequency lesser than the first frequency when signal PEAK_DETECT is not asserted. Thus, where magnitude of audio output signal $V_{OUT}$ approaches either of the positive polarity voltage or negative polarity voltage of $V_{SUPPLY}$ (as indicated by the signal PEAK_DETECT which is generated from digital audio input signal DIG_IN or another signal indicative of audio output signal $V_{OUT}$), switches for switching one or more capacitors providing the particular polarity of supply voltage $V_{SUPPLY}$ may switch at a greater frequency relative to that in which the magnitude of audio output signal $V_{OUT}$ is not near either of the positive polarity voltage or negative polarity voltage of supply voltage $V_{SUPPLY}$. Thus, responsive to a magnitude of a difference between audio output signal $V_{OUT}$ and the positive polarity voltage of supply voltage $V_{SUPPLY}$ being less than a predetermined threshold, charge pump power supply 10 may operate the switches for switching one or more capacitors providing the positive polarity voltage of supply voltage $V_{SUPPLY}$ at a first frequency, and responsive to the magnitude of difference between audio output signal $V_{OUT}$ and the positive polarity voltage of supply voltage $V_{SUPPLY}$ being greater than the predetermined threshold, charge pump power supply 10 may operate the switches for switching one or more capacitors providing the positive polarity voltage of supply voltage $V_{SUPPLY}$ at a second frequency less than the first frequency. Similarly, responsive to a magnitude of a difference between audio output signal $V_{OUT}$ and the negative polarity voltage of supply voltage $V_{SUPPLY}$ being less than a predetermined threshold, charge pump power supply 10 may operate switches for switching one or more capacitors providing the negative polarity voltage of supply voltage $V_{SUPPLY}$ at a first frequency, and responsive to the magnitude of the difference between audio output signal $V_{OUT}$ and the negative polarity voltage of supply voltage $V_{SUPPLY}$ being greater than the predetermined threshold, charge pump power supply 10 may operate the switches for switching one or more capacitors providing the negative polarity voltage of supply voltage $V_{SUPPLY}$ at a second frequency less than a first frequency. Accordingly, audio IC 9 may utilize output signal magnitude information to provide reduction in power consumption of a charge pump power supply, as compared with traditional approaches.

As described in greater detail elsewhere in this disclosure, charge pump power supply 10 may include a plurality of capacitors and a switching circuit for switching the capacitors to provide supply voltage $V_{SUPPLY}$ in accordance with the select input. In addition, switches of the switching circuit may be operated based on the polarity of audio output signal $V_{OUT}$. For example, responsive to the signal polarity signal indicating a positive polarity of the output signal, switches for switching one or more capacitors providing a positive polarity of supply voltage $V_{SUPPLY}$ in a particular operating mode of charge pump power supply 10 may be configured to switch at a greater frequency than switches for switching one or more capacitors providing a negative polarity of supply voltage $V_{SUPPLY}$ in the particular operating mode. Conversely, responsive to the signal polarity signal indicating a negative polarity of the output signal, switches for switching one or more capacitors providing the negative polarity of supply voltage $V_{SUPPLY}$ in the particular operating mode of charge pump power supply 10 may be configured to switch at a greater frequency than switches for switching one or more capacitors providing the positive polarity of supply voltage $V_{SUPPLY}$ in the particular operating mode. To further illustrate, as shown in FIG. 3, two or more clock signals comprising signals CLK and CLK2, may be provided to charge pump power supply 10, wherein the frequency of CLK may be greater than that of CLK2. Thus, in Mode 1 described above, when audio output signal $V_{OUT}$ has a positive polarity, switch S8 may be clocked by signal CLK and switches S3, S6, S5, and S7 may be clocked by signal CLK2, and when audio output signal $V_{OUT}$ has a negative polarity, switch S8 may be clocked by signal CLK2 and switches S3, S6, S5, and S7 may be clocked by signal CLK. Similarly, in Mode 2 described above, when audio output signal $V_{OUT}$ has a positive polarity, switches S1, S2, and S4 may be clocked by signal CLK and switches S6, S5, and S7 may be clocked by signal CLK2, and when audio output signal $V_{OUT}$ has a negative polarity, switches S2 and S4 may be clocked by signal CLK2 and switches S1, S6, S5, and S7 may be clocked by signal CLK. In Mode 2, switch S1 may be clocked by the higher-frequency clock CLK for either polarity of audio output signal $V_{OUT}$, as switch S1 is used to provide both the positive polarity and negative polarity of power supply voltage $V_{SUPPLY}$ in Mode 2. Accordingly, audio IC 9 may utilize output signal polarity information to provide reduction in power consumption of a charge pump power supply, as compared with traditional approaches.

Figure 5A:
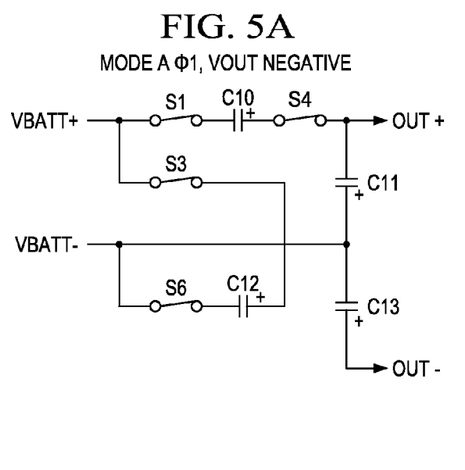
FIGS. 5A-5D are schematic diagrams depicting individual charge-pump clock phases for operating modes of the charge-pump power supply circuit depicted in FIG. 3, in accordance with embodiments of the present disclosure.
Figure 5B:
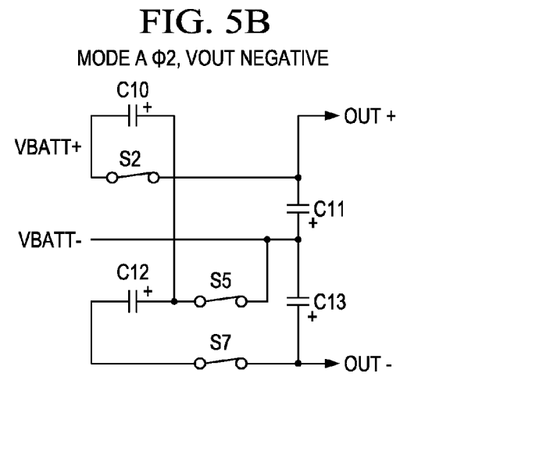
Figure 5C:
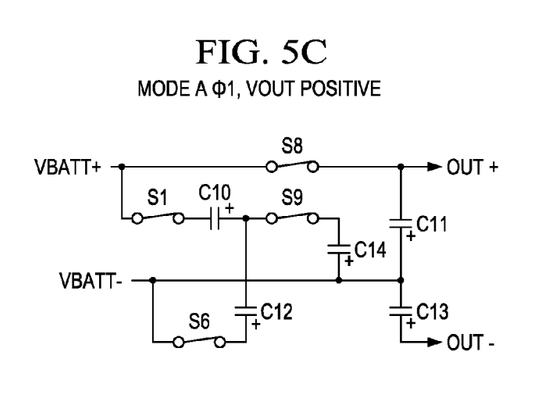
Figure 5D:
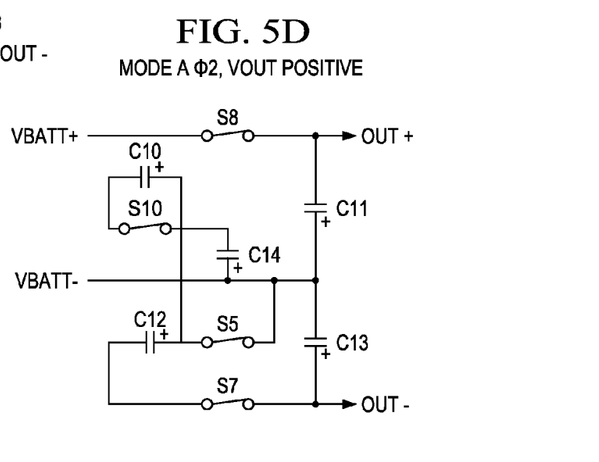

Also as described elsewhere in this disclosure, based on the polarity of audio output signal $V_{OUT}$, charge pump power supply 10 may generate a positive polarity voltage of supply voltage $V_{SUPPLY}$ of a particular magnitude relative to the common-mode voltage of charge pump power supply 10 and a negative polarity voltage of supply voltage $V_{SUPPLY}$ of a different magnitude relative to the common-mode voltage. To illustrate, in particular embodiments charge pump power supply 10 may operate in a first mode ("Mode A") in which it generates a maximum positive polarity voltage of $V_{MAX}$ and a minimum negative polarity voltage of $-V_{MAX}$, and may operate in a second mode ("Mode B") in which it generates a maximum positive polarity voltage of $V_{MAX}/2$ and a minimum negative polarity voltage of $-V_{MAX}/2$. When charge pump power supply 10 is operating in Mode A (in accordance with the mode select signal), charge pump power supply 10 may generate a negative polarity voltage of $-V_{MAX}$ and a positive polarity voltage of $V_{MAX}/2$ when the audio output signal $V_{OUT}$ has a negative polarity, and thus have an equivalent circuit arrangement similar or identical to that shown in FIG. 5A for phase one ($\phi_1$) of Mode A and an equivalent circuit arrangement similar or identical to that shown in FIG. 5B for phase two ($\phi_2$) of Mode A. When charge pump power supply 10 is operating in Mode A (in accordance with the mode select signal), charge pump power supply 10 may generate a positive polarity voltage of $V_{MAX}$ and a negative polarity voltage of $-V_{MAX}/2$ when the audio output signal $V_{OUT}$ has a positive polarity, and thus may have an equivalent circuit arrangement similar or identical to that shown in FIG. 5C for phase one ($\phi_1$) of Mode A and an equivalent circuit arrangement similar or identical to that shown in FIG. 5D for phase two ($\phi_2$) of Mode A. With respect to FIGS. 5C and 5D, switches S9 and S10 and capacitor C14 are present which are not depicted in FIG. 3. Thus, in embodiments where charge pump power supply 10 operates in response to a polarity of audio output signal $V_{OUT}$, charge pump power supply depicted in FIG. 3 may be modified to include switches S9 and S10 and capacitor C14.

When charge pump power supply 10 is operating in Mode B (in accordance with the mode select signal), charge pump power supply 10 may generate a positive polarity voltage of $V_{MAX}/2$ and a negative polarity voltage of $-V_{MAX}/2$ regardless of the polarity of audio output signal $V_{OUT}$, and thus may have an equivalent circuit arrangement similar or identical to that shown in FIG. 4C for phase one ($\phi_1$) of Mode B and an equivalent circuit arrangement similar or identical to that shown in FIG. 4D for phase two ($\phi_2$) of Mode B.

Accordingly, in the embodiments where charge pump power supply 10 operates in response to a polarity of audio output signal $V_{OUT}$, when the polarity of audio output signal $V_{OUT}$ is positive, a magnitude of a difference between the positive polarity voltage and the common-mode voltage may be equal to a particular mode-dependent voltage and a magnitude of a difference between the negative polarity voltage and the common-mode voltage may be substantially equal to a rational fraction of the particular mode-dependent voltage, while when the polarity of audio output signal $V_{OUT}$ is negative, a magnitude of a difference between the negative polarity voltage and the common-mode voltage may be equal to a particular mode-dependent voltage and a magnitude of a difference between the positive polarity voltage and the common-mode voltage may be substantially equal to a rational fraction of the particular mode-dependent voltage. In such embodiments, the various logic gates (e.g., AND gates) of charge pump power supply 10 may be configured to provide for different magnitude of voltages being supplied to the outputs of charge pump power supply 10. Accordingly, audio IC 9 may utilize output signal polarity information to provide reduction in power consumption of a charge pump power supply, as compared with traditional approaches.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio amplifier circuit for providing an output signal to an audio transducer, the audio amplifier circuit comprising:
    a power amplifier having an audio input for receiving an audio input signal, an audio output for providing the output signal, and a power supply input; and
    a charge pump power supply for providing a power supply voltage to the power supply input, wherein the power supply voltage has a first polarity voltage relative to a common-mode voltage and a second polarity voltage relative to the common-mode voltage such that the power supply voltage equals a difference between the first polarity voltage and the second polarity voltage, wherein:
        the charge pump power supply has a select input for selecting an operating mode of the power supply;
        in a first operating mode, the power supply voltage is equal to a first voltage, and wherein in a second operating mode the power supply voltage is substantially equal to a rational fraction of the first voltage;
        the charge pump comprises a plurality of capacitors and a switching circuit for switching the capacitors to provide the first voltage or the second voltage in accordance with the select input;
        the charge pump power supply has a signal polarity input for indicating a polarity of the output signal;
        switches for switching one or more capacitors providing the first polarity voltage in a then-current operating mode are configured to switch at a greater frequency than switches for switching one or more capacitors providing the second polarity voltage responsive to the signal polarity input indicating a positive polarity of the output signal; and
        switches for switching one or more capacitors providing the first polarity voltage in a then-current operating mode are configured to switch at a lesser frequency than switches for switching one or more capacitors providing the second polarity voltage responsive to the signal polarity input indicating a negative polarity of the output signal.

2. The audio amplifier circuit of claim 1, further comprising a control circuit for generating the signal polarity input based on the polarity of the output signal.

3. The audio amplifier circuit of claim 2, wherein the control circuit determines the polarity of the output signal based on a sign bit of a digital audio input signal.

4. The audio amplifier circuit of claim 2, wherein:
    the power amplifier further comprises at least one driving device for generating the output signal based on the audio input signal; and
    the control circuit determines the polarity of the output signal based on a ratio of load current to quiescent current in the at least one driving device.

5. The audio amplifier circuit of claim 2, wherein:
the charge pump power supply further comprises an input for receiving a source voltage; and
the control circuit determines the polarity of the output signal based on a voltage difference between the power supply voltage and the source voltage.

6. The audio amplifier circuit of claim 1, wherein, in a particular operating mode:
when the signal polarity input indicates the positive polarity of the output signal, a magnitude of a difference between the first polarity voltage and the common-mode voltage is equal to a particular mode-dependent voltage and a magnitude of a difference between the second polarity voltage and the common-mode voltage is substantially equal to a rational fraction of the particular mode-dependent voltage; and
when the signal polarity input indicates the negative polarity of the output signal, the magnitude of the difference between the second polarity voltage and the common-mode voltage is equal to the particular mode-dependent voltage and the magnitude of the difference between the first polarity voltage and the common-mode voltage is substantially equal to the rational fraction of the particular mode-dependent voltage.

7. The audio amplifier circuit of claim 1, wherein:
responsive to a magnitude of a difference between the output signal and the first polarity voltage being less than a predetermined threshold, the charge pump power supply operates the switches for switching one or more capacitors providing the first polarity voltage at a first frequency; and
responsive to the magnitude of the difference between the output signal and the first polarity voltage being greater than the predetermined threshold, the charge pump power supply operates the switches for switching one or more capacitors providing the first polarity voltage at a second frequency less than the first frequency.

8. The audio amplifier circuit of claim 1, wherein:
responsive to a magnitude of a difference between the output signal and the second polarity voltage being less than a predetermined threshold, the charge pump power supply operates the switches for switching one or more capacitors providing the second polarity voltage at a first frequency; and
responsive to the magnitude of the difference between the output signal and the second polarity voltage being greater than the predetermined threshold, the charge pump power supply operates the switches for switching one or more capacitors providing the second polarity voltage at a second frequency less than the first frequency.

9. The audio amplifier circuit of claim 1, wherein:
the power amplifier includes at least one switching device for generating a first polarity of the output signal and at least one switching device for generating a second polarity of the output signal based on the audio input signal;
responsive to the signal polarity input indicating a positive polarity of the output signal, the at least one switching device for providing the first polarity voltage operates at a first current; and
responsive to the signal polarity input indicating a negative polarity of the output signal, the at least one switching device for providing the first polarity voltage operates at a second current less than the first current.

10. The audio amplifier circuit of claim 1, wherein:
the power amplifier includes at least one switching device for generating a first polarity of the output signal and at least one switching device for generating a second polarity of the output signal based on the audio input signal;
responsive to the signal polarity input indicating a negative polarity of the output signal, the at least one switching device for providing the second polarity voltage operates at a first current; and
responsive to the signal polarity input indicating a positive polarity of the output signal, the at least one switching device for providing the second polarity voltage operates at a second current less than the first current.

11. The audio circuit of claim 1, wherein the power supply voltage is a single-ended voltage referenced to a ground voltage in which the common-mode voltage is equal to one-half of a maximum power supply voltage and the second polarity voltage has a minimum equal to the ground voltage.

12. The audio circuit of claim 1, wherein the power supply voltage is a differential voltage in which the common-mode voltage is equal to a mean of a maximum first polarity voltage and a minimum second polarity voltage.

13. A method for providing an output signal to an audio transducer, comprising:
providing by a charge pump power supply a power supply voltage to a power supply input of a power amplifier having an audio input for receiving an audio input signal and an audio output for providing the output signal, wherein:
the power supply voltage has a first polarity voltage relative to a common-mode voltage and a second polarity voltage relative to the common-mode voltage such that the power supply voltage equals a difference between the first polarity voltage and the second polarity voltage, wherein:
the charge pump power supply has a select input for selecting an operating mode of the power supply;
in a first operating mode, the power supply voltage is equal to a first voltage, and wherein in a second operating mode the power supply voltage is substantially equal to a rational fraction of the first voltage;
the charge pump comprises a plurality of capacitors and a switching circuit for switching the capacitors to provide the first voltage or the second voltage in accordance with the select input; and
the charge pump power supply has a signal polarity input for indicating a polarity of the output signal;
switching switches for switching one or more capacitors providing the first polarity voltage in a then-current operating mode at a greater frequency than the switches for switching one or more capacitors providing the second polarity voltage responsive to the signal polarity input indicating a positive polarity of the output signal; and
switching switches for switching one or more capacitors providing the first polarity voltage in a then-current operating mode at a lesser frequency than the switches for switching one or more capacitors providing the second polarity voltage responsive to the signal polarity input indicating a negative polarity of the output signal.

14. The method of claim 13, further comprising generating the signal polarity input based on the polarity of the output signal.

15. The method of claim 14, further comprising determining the polarity of the output signal based on a sign bit of a digital audio input signal.

16. The method of claim 14, wherein:
the power amplifier further comprises at least one driving device for generating the output signal based on the audio input signal; and determining the polarity of the output signal further comprises determining the polarity based on a ratio of load current to quiescent current in the at least one driving device.

17. The method of claim 14, wherein:
the charge pump power supply further comprises an input for receiving a source voltage; and
determining the polarity of the output signal further comprises determining the polarity based on a voltage difference between the power supply voltage and the source voltage.

18. The method of claim 13, wherein, in a particular operating mode:
when the signal polarity input indicates the positive polarity of the output signal, a magnitude of a difference between the first polarity voltage and the common-mode voltage is equal to a particular mode-dependent voltage and a magnitude of a difference between the second polarity voltage and the common-mode voltage is substantially equal to a rational fraction of the particular mode-dependent voltage; and
when the signal polarity input indicates the negative polarity of the output signal, the magnitude of the difference between the second polarity voltage and the common-mode voltage is equal to the particular mode-dependent voltage and the magnitude of the difference between the first polarity voltage and the common-mode voltage is substantially equal to a rational fraction of the particular mode-dependent voltage.

19. The method of claim 13, further comprising:
responsive to a magnitude of a difference between the output signal and the first polarity voltage being less than a predetermined threshold, operating the switches for switching one or more capacitors providing the first polarity voltage at a first frequency; and
responsive to the magnitude of the difference between the output signal and the first polarity voltage being greater than the predetermined threshold, operating the switches for switching one or more capacitors providing the first polarity voltage at the second frequency less than a first frequency.

20. The method of claim 13, further comprising:
responsive to a magnitude of a difference between the output signal and the second polarity voltage being less than a predetermined threshold, operating the switches for switching one or more capacitors providing the second polarity voltage at a first frequency; and
responsive to the magnitude of the difference between the output signal and the second polarity voltage being greater than the predetermined threshold, operating the switches for switching one or more capacitors providing the second polarity voltage at the second frequency less than a first frequency.

21. The method of claim 13, further comprising:
responsive to the signal polarity input indicating a positive polarity of the output signal, operating the at least one switching device for providing the first polarity voltage at a first current; and
responsive to the signal polarity input indicating a negative polarity of the output signal, operating the at least one switching device for providing the first polarity voltage at a second current less than the first current.

22. The method of claim 13, further comprising:
responsive to the signal polarity input indicating a negative polarity of the output signal, operating the at least one switching device for providing the second polarity voltage at a first current; and
responsive to the signal polarity input indicating a positive polarity of the output signal, operating the at least one switching device for providing the second polarity voltage at a second current less than the first current.

23. The method of claim 13, wherein the power supply voltage is a single-ended voltage referenced to a ground voltage in which the common-mode voltage is equal to one-half of a maximum power supply voltage and the second polarity voltage has a minimum equal to the ground voltage.

24. The method of claim 13, wherein the power supply voltage is a differential voltage in which the common-mode voltage is equal to a mean of a maximum first polarity voltage and a minimum second polarity voltage.

* * * * *